United States Patent [19]
Alavi et al.

[11] Patent Number: 6,096,610
[45] Date of Patent: Aug. 1, 2000

[54] TRANSISTOR SUITABLE FOR HIGH VOLTAGE CIRCUIT

[75] Inventors: Mohsen Alavi; Tahir Ghani, both of Beaverton, Oreg.

[73] Assignee: Intel Corporation, Santa Clara, Calif.

[21] Appl. No.: 08/780,415

[22] Filed: Jan. 8, 1997

Related U.S. Application Data

[62] Division of application No. 08/623,673, Mar. 29, 1996, abandoned.

[51] Int. Cl.[7] .................................................. H01L 21/336
[52] U.S. Cl. ........................... 438/286; 438/510; 438/514
[58] Field of Search .................................... 438/142, 179, 438/199, 197, 286, 279, 280, FOR 190, FOR 175, 514, 510

[56] References Cited

U.S. PATENT DOCUMENTS

| | | | |
|---|---|---|---|
| 3,600,642 | 8/1971 | Allison et al. | 257/343 |
| 3,883,372 | 5/1975 | Lin | 438/286 |
| 4,394,674 | 7/1983 | Sakuma et al. | 257/336 |
| 4,543,594 | 9/1985 | Mohsen et al. | 357/51 |
| 4,689,504 | 8/1987 | Raghunathan et al. | 307/449 |
| 4,730,129 | 3/1988 | Kunitoki et al. | 327/525 |
| 5,112,766 | 5/1992 | Fujii et al. | 438/179 |
| 5,252,848 | 10/1993 | Adler et al. | 257/335 |
| 5,278,787 | 1/1994 | Iwasa | 257/335 |
| 5,296,409 | 3/1994 | Merrill et al. | 438/189 |
| 5,306,656 | 4/1994 | Williams et al. | 438/283 |
| 5,334,880 | 8/1994 | Abadeer et al | 327/526 |
| 5,369,045 | 11/1994 | Ng et al. | 438/286 |
| 5,371,394 | 12/1994 | Ma et al. | 257/335 |
| 5,374,843 | 12/1994 | Williams et al. | 257/335 |
| 5,399,917 | 3/1995 | Allen et al. | 327/436 |
| 5,414,364 | 5/1995 | McCollum | 327/525 |
| 5,420,450 | 5/1995 | Yoneda et al. | 257/401 |
| 5,434,531 | 7/1995 | Allen et al. | 327/530 |
| 5,465,054 | 11/1995 | Erhart | 326/81 |

(List continued on next page.)

FOREIGN PATENT DOCUMENTS

| | | |
|---|---|---|
| 354069387 | 6/1979 | Japan . |
| 353066181A | 6/1998 | Japan . |

OTHER PUBLICATIONS

Wolf, S.; Silicon Processing for the VLSI Era vol. 3: The Submicron MOSFET, Sunset Beach, CA, pp.636 637, Jan. 1995.

Wolf, S., Tauber R.N.; Silicon Processing for the VLSI Era vol. 1: Process Technology, Lattice Press, Sunset Beach, CA, p. 124, Jan. 1986.

"Metal–to Metal Antifuses with Very Thin Silicon Dioxide Films", Zhang et al., pp. 310–312, *IEEE*, 1994.

*CMOS Technology and Devices*, Masakazu, S., pp. 74–75, AT&T, 1988.

*VSLI Technology*, 2nd Edition, Sze, S.M., pp. 466–513, AT&T, 1988.

*Primary Examiner*—John F. Niebling
*Assistant Examiner*—Christopher Lattin
*Attorney, Agent, or Firm*—Blakely, Sokoloff, Taylor & Zafman LLP

[57] ABSTRACT

A method and an apparatus for forming a transistor suitable for a high voltage circuit. In one embodiment, the transistor is formed without adding any steps to an existing state-of-the-art CMOS process. A well is implanted into a portion of a substrate such that the well has a higher doping concentration than the substrate. A first diffusion region is then implanted into the substrate such that at least a portion of the first diffusion is disposed within the well. In addition, a second diffusion is implanted into the substrate separated from the well such that the second diffusion region is disposed entirely outside the well. A channel region is disposed between the first and second regions and gate is disposed over the channel region to form the high voltage transistor. Since the second diffusion region is disposed entirely outside the well in the lower doped substrate, a higher junction breakdown voltage is realized. Furthermore, with the transistor layout described herein having at least a portion of the first diffusion region disposed within the well, adequate device isolation is also realized.

15 Claims, 11 Drawing Sheets

U.S. PATENT DOCUMENTS

| | | | |
|---|---|---|---|
| 5,514,608 | 5/1996 | Williams et al. | 438/286 |
| 5,514,980 | 5/1996 | Pilling et al. | 327/525 |
| 5,536,666 | 7/1996 | Miller et al. | 438/179 |
| 5,574,303 | 11/1996 | Terasima et al. | 257/401 |
| 5,578,509 | 11/1996 | Fujita | 438/286 |
| 5,583,454 | 12/1996 | Hawkins et al. | 326/81 |
| 5,661,048 | 8/1997 | Davies et al. | 438/217 |
| 5,776,811 | 7/1998 | Wang et al. | 438/264 |

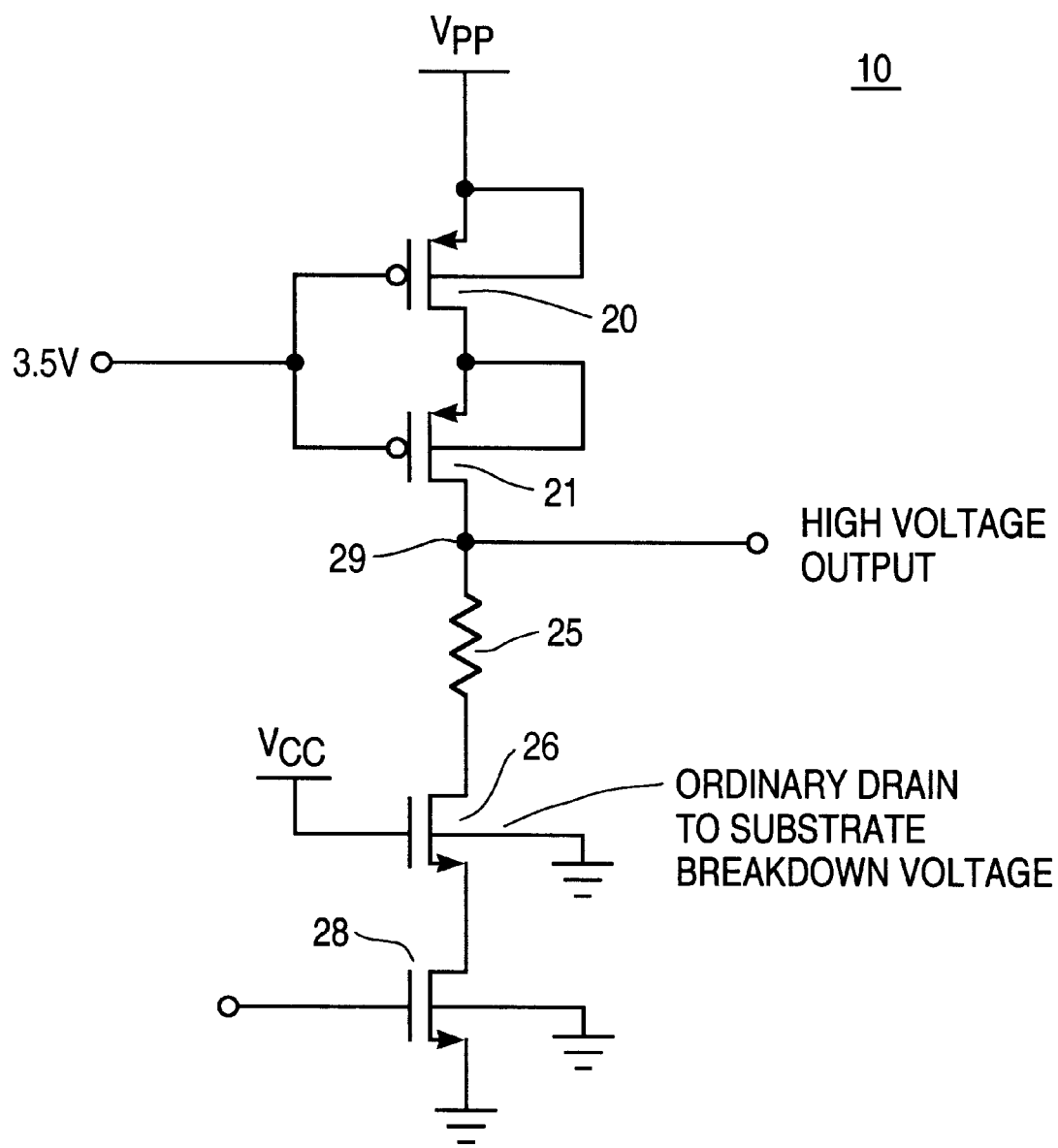
FIG_1 (PRIOR ART)

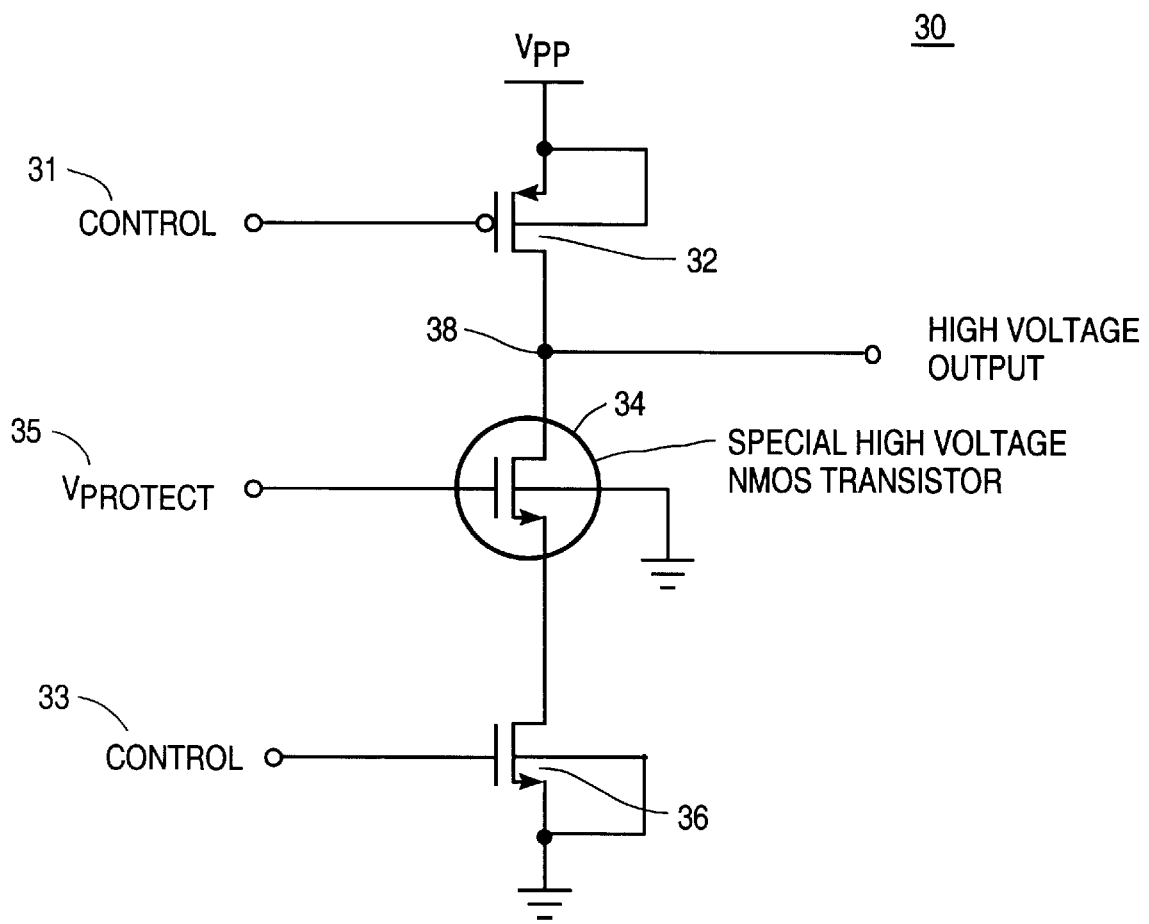
FIG_2A

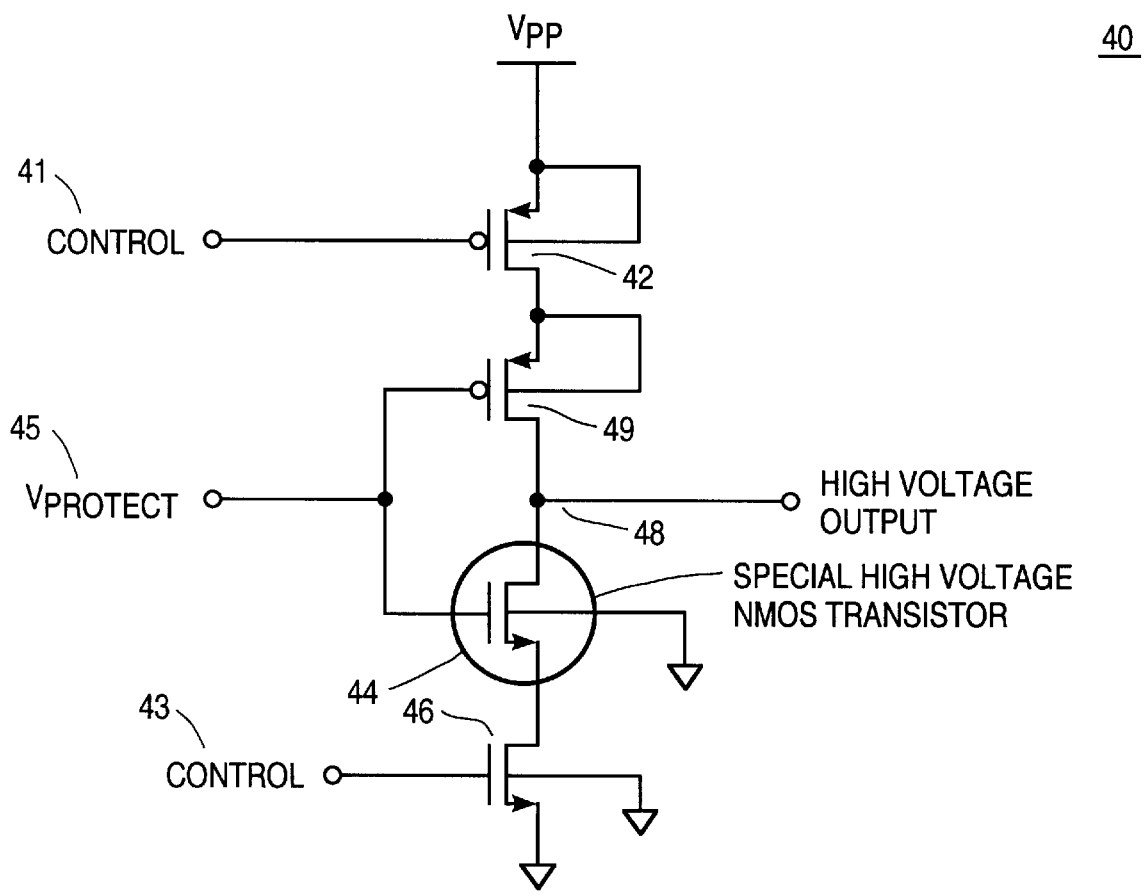
FIG_2B

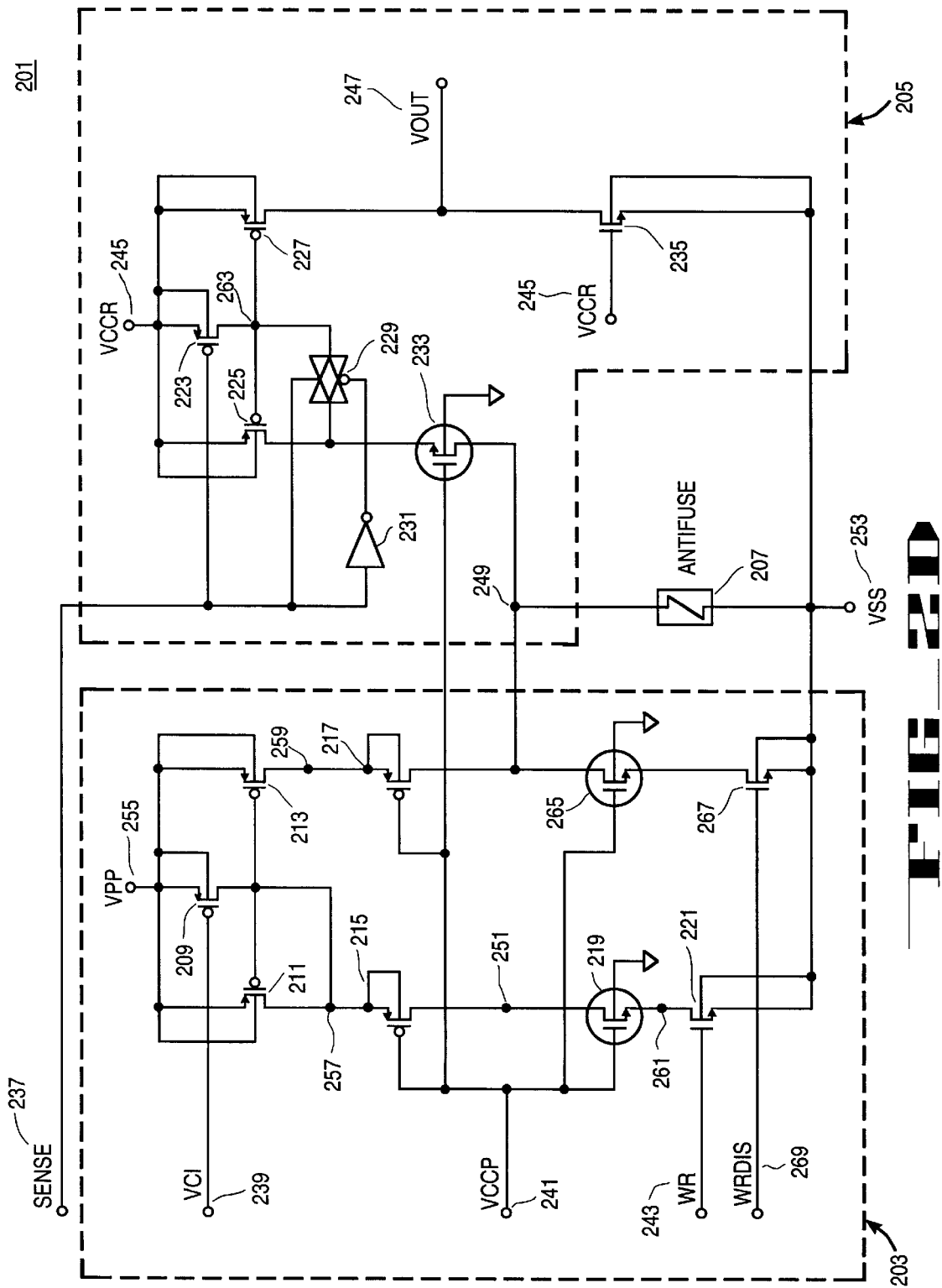

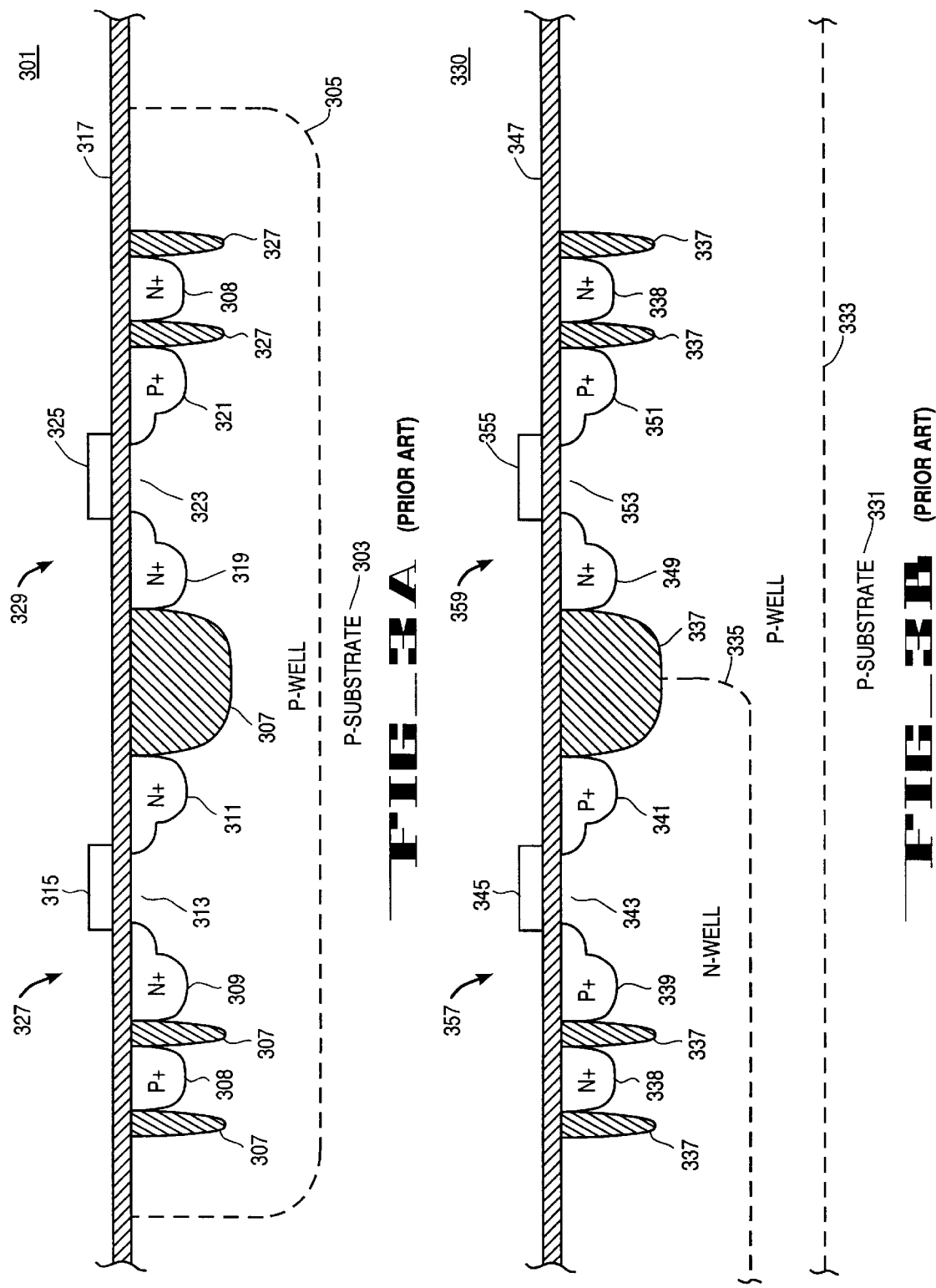

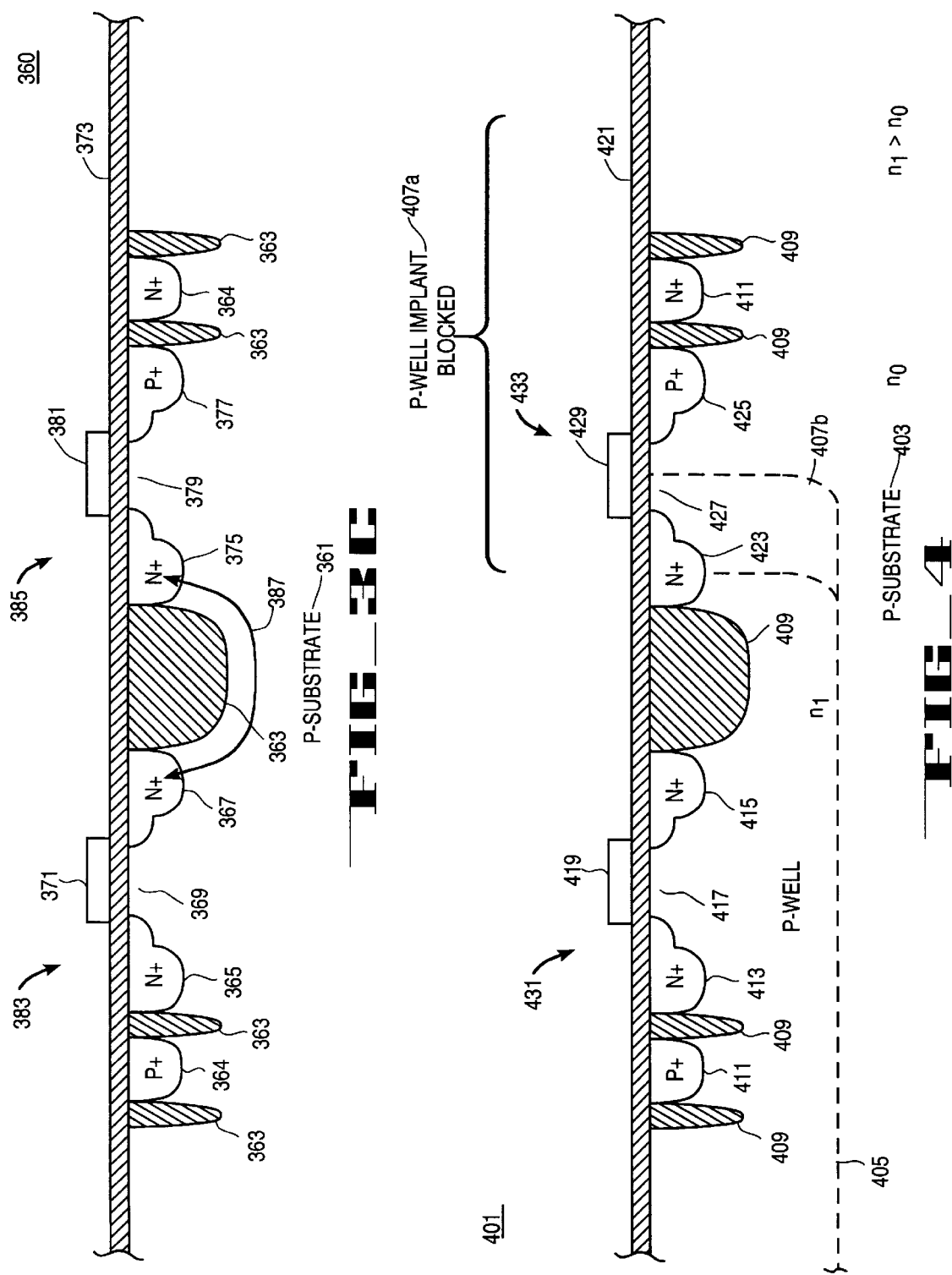

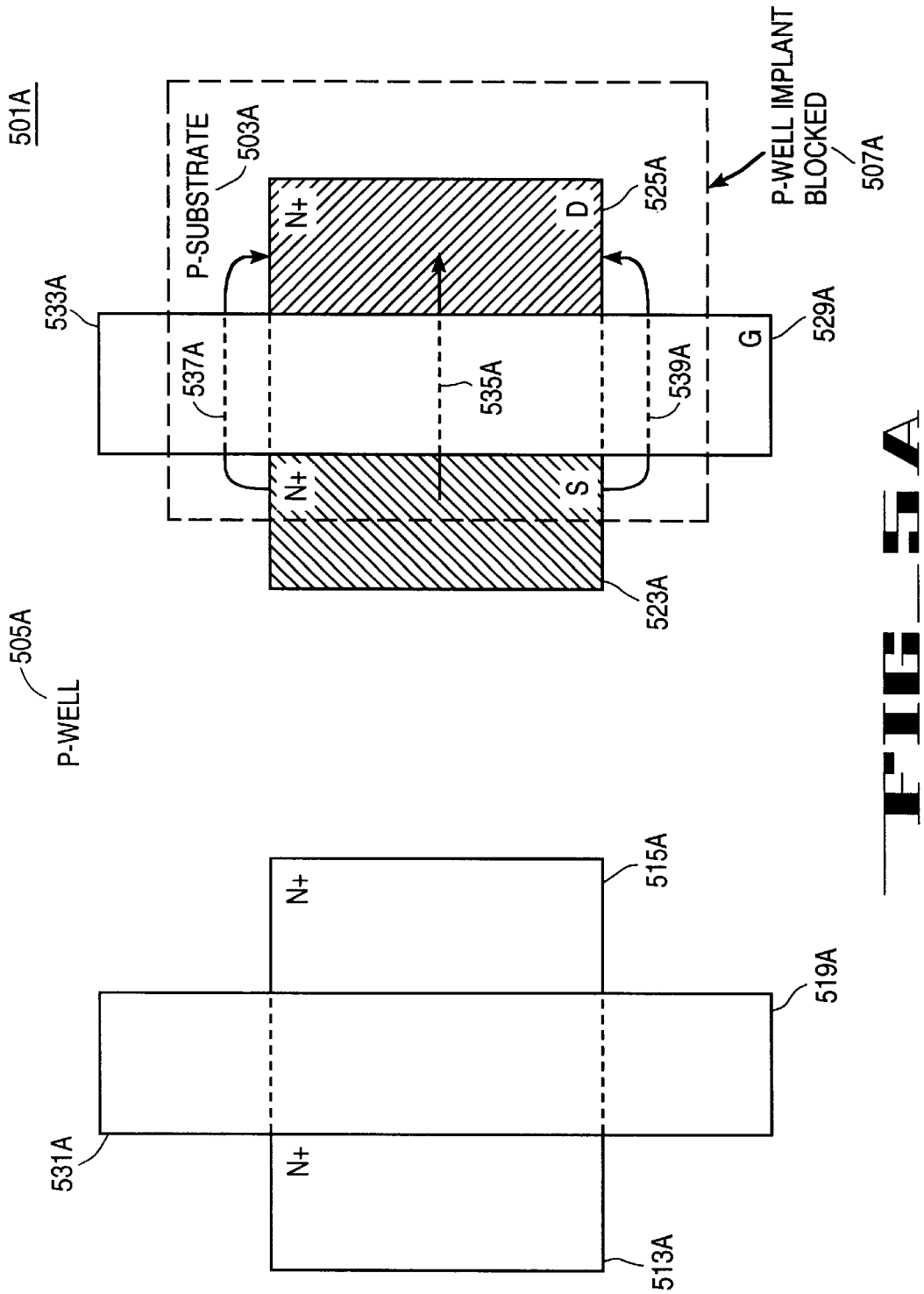
FIG_5A

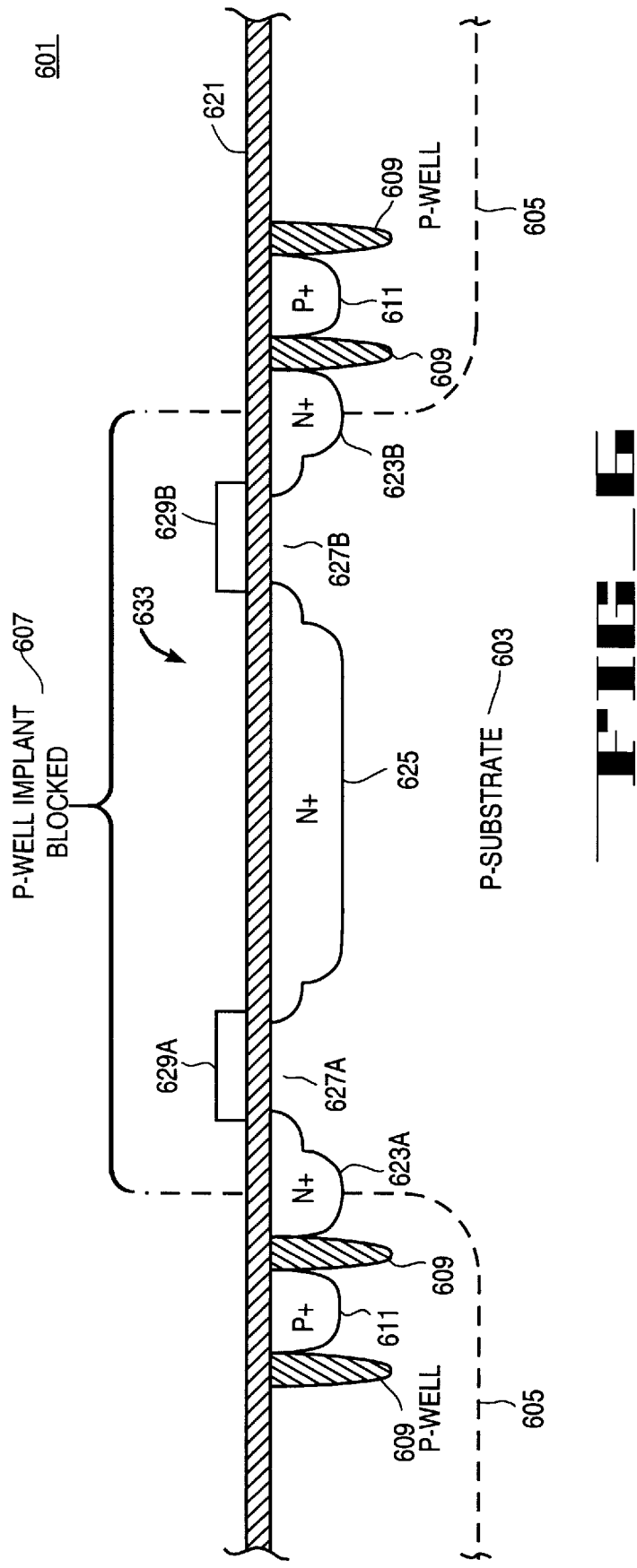
FIG._6

TRANSISTOR SUITABLE FOR HIGH VOLTAGE CIRCUIT

This is a divisional of application Ser. No. 08/623,673, filed Mar. 29, 1996 now abandoned.

BACKGROUND OF THE INVENTION

1. Field of the Invention

The present invention relates generally to integrated circuits and more specifically, the present invention relates to high voltage transistors used in integrated circuits.

2. Related Application

This application is related to co-pending application Ser. No. 08/623,969, filed Mar. 29, 1996, entitled "Method and Apparatus for Providing High Voltage With A Low Voltage CMOS Integrated Circuit," and assigned to the Assignee of the present application.

3. Description of the Related Art

In the integrated circuit industry there is a continuing effort to increase circuit speed as well decrease integrated circuit device sizes. Modern microprocessors contain an increasing number of devices in smaller areas of integrated circuit substrate. To achieve this increased packing density, integrated circuit devices are "scaled" in size and reduced in dimension. A consequence of this scaling is that oxide thicknesses and junction breakdown voltages are reduced proportionally. Although reducing the oxide thicknesses may be necessary when reducing the overall sizes of transistor devices, the associated thinner oxides are problematic for high voltage transistors.

Since the voltage levels that can be tolerated by state-of-the-art integrated circuits is constantly decreasing, the maximum input and output voltages that are generated by such integrated circuits is decreasing correspondingly. Consequently, ordinary modern integrated circuits are low voltage tolerant and are therefore unable to interface with high voltage devices without suffering gate oxide or junction breakdown.

One application which requires the application of high voltages from a low voltage tolerant circuit is the programming of discretionary connections such as antifuse devices or the like. Antifuse devices are used as programming elements in electrically programmable read only memory (PROM). When an antifuse device is initially fabricated, it provides a high resistance connection. However, after the antifuse is programmed, or fused, it provides a permanent low resistance electrical connection.

Unfused antifuse devices are generally programmed with the application of a high programming voltage and current. After the application of the programming voltage and current, the antifuse is permanently programmed from a high resistance to a low resistance electrical connection.

One problem with programming antifuse devices with low voltage tolerant CMOS integrated circuits is that the voltages required to fuse the device often exceed the maximum junction breakdown voltage limits of ordinary CMOS integrated circuit transistors. As described earlier, with the trend of integrated circuit device sizes being scaled down, the maximum gate and junction breakdown voltages of many modern integrated circuit processes are continuing to decrease. Consequently, modern prior art CMOS circuits are unable to tolerate the high programming voltages required to program antifuse devices without expensive modifications to the manufacturing process.

Some prior art techniques of implementing low voltage tolerant circuits capable of providing a high voltage output are described in U.S. Pat. No. 5,399,917 entitled "High Voltage Tolerant Switch Constructed for a Low Voltage CMOS Process" and U.S. Pat. No. 5,434,531 entitled "High Voltage Tolerant Switch Constructed for a Low Voltage CMOS Process." Each of the above-listed prior art patents are assigned to the Assignee of the present invention.

FIG. 1 is an example of one prior art integrated circuit 10 which is capable of providing a high voltage output at node 29. Prior art circuit consists of ordinary low voltage CMOS transistors including p-channel transistor pair 20 and 21 coupled in series between VPP and output node 29. Resistor 25 and n-channel transistor pair 26 and 28 are coupled in series between output node 29 and ground.

In the prior art embodiment shown in FIG. 1, VPP is a high voltage which may be greater than that which prior art circuit 10 is designed to tolerate across any individual transistor gate to drain, gate to source, or between drain to source. Assuming n-channel transistor 28 is switched on, output node 29 is pulled down to ground through n-channel transistors 26 and 28. Thus, assuming VPP is 7 volts, 7 volts are distributed across p-channel transistor pair 20 and 21. With the substrate of p-channel transistor 20 coupled to VPP, the substrate of p-channel transistor 21 coupled between the source and drain of transistors 20 and 21, and the gates of p-channel transistors 20 and 21 coupled to 3.5 volts, there are no p-channel transistor gate to drain, gate to source or drain to source connections that are subjected to the entire 7 volts of VPP.

However, assuming n-channel transistor 28 is switched off, output node 29 is pulled up to VPP. Accordingly, 7 volts are distributed across n-channel transistors 26 and 28. Although there are no n-channel transistor gate to drain, gate to source or drain to source connections subjected to 7 volts, the drain to substrate junction of n-channel transistor is subjected to the entire 7 volts.

Consequently, the breakdown voltage of the drain to substrate junction of a transistor configured such as of n-channel transistor 26 determines an upper limit to the maximum amount of voltage which may be supplied by low voltage integrated circuits such as prior art circuit 10. As the trend towards smaller devices with higher packing density continues in the integrated circuit industry, the problems associated with the breakdown voltage of the drain or source to substrate junctions in transistors becomes increasingly significant.

Therefore, what is needed is a high voltage transistor which would not limit the maximum amount of voltage which may be supplied by low voltage integrated circuits. To keep costs as low as possible, such a high voltage transistor would be implemented in an existing state-of-the-art CMOS process without adding any costly process steps, such as masking, implantation or doping. The high voltage transistor would be useful in a number of high voltage applications such as antifuse programming, or any other application that requires interfacing low voltage integrated circuits with high voltage devices. Other applications in which such a high voltage transistor might be useful include EPROM programming, interfacing with high voltage buses, driving liquid crystal displays etc.

SUMMARY OF THE INVENTION

A method and an apparatus for forming a transistor suitable for a high voltage circuit is disclosed. In one embodiment, a well implant is formed in a portion of a substrate wherein the well implant has a doping concentration higher than the doping concentration of the substrate. A first diffusion region is implanted into the substrate such that at least a portion of the first diffusion region is disposed within the well implant. In addition, a second diffusion region is implanted into the substrate outside the well implant such that the second diffusion region is spaced apart from the first diffusion region and a channel is formed between the first and second diffusion regions. Finally, a gate is disposed above the channel to form the transistor. With the second diffusion region formed in the substrate outside of the well, a high junction breakdown voltage is realized. Additional features and benefits of the present invention will become apparent from the detailed description, figures and claims set forth below. Other features and advantages of the present invention will become apparent from the accompanying drawings and from the detailed description which follows below.

BRIEF DESCRIPTION OF THE DRAWINGS

The present invention is illustrated by way of example and not limitation in the accompanying figures.

FIG. 1 is a schematic of a prior art integrated circuit which provides a high voltage from an integrated circuit.

FIGS. 2A and 2B are schematics of two embodiments of integrated circuits which provide a high voltage output in accordance with the teachings of the present invention.

FIGS. 2C and 2D are schematics of two embodiments of antifuse programming and sensing integrated circuits in accordance with the teachings of the present invention.

FIGS. 3A and 3B are illustrations of cross-sections of prior art MOS and CMOS devices.

FIG. 3C is an illustration of a cross-section of MOS integrated circuit devices in a substrate without a well implant.

FIG. 4 is an illustration of a cross section of a high voltage MOS device in accordance with the teachings of the present inventions.

FIG. 6 is an illustration of another embodiment of a high voltage MOS transistor in accordance with the teachings of the present invention.

DETAILED DESCRIPTION

A method and an apparatus for forming a transistor suitable for a high voltage circuit is disclosed. In the following description, numerous specific details are set forth such as voltages, currents, etc. in order to provide a thorough understanding of the present invention. It will be obvious, however, to one having ordinary skill in the art that the specific details need not be employed to practice the present invention. In other instances, well known materials or methods have not been described in detail in order to avoid unnecessarily obscuring the present invention.

As indicated above, there are a variety of uses for low voltage integrated circuits which can tolerate high voltages. An application that requires high voltages and currents is the fusing of discretionary connections such as antifuse devices.

An antifuse is essentially a thin oxide disposed between two layers of conductor. In one embodiment of the present invention, an NMOS transistor is used to form the antifuse by electrically coupling the source, drain and substrate to ground with the gate of the transistor coupled to the circuit provided by the present invention. By applying an appropriate high programming voltage and current for a sufficient amount of time to the gate of the antifuse device, a pinhole is formed in the gate oxide of the transistor which causes the eventual breakdown of the antifuse. Before the breakdown of the gate oxide of the antifuse, the antifuse forms a high resistance electrical connection. However, after the breakdown of the gate oxide, the antifuse remains in a permanent on state forming a low resistance electrical connection.

In one embodiment of the present invention, an antifuse has a gate oxide thickness of 3.5 nanometers. The gate oxide has an oxide breakdown voltage of 5.5 volts. The junction breakdown voltage of the transistors made by the same process is 6.5 volts for regular NMOS, 7 volts for regular PMOS and greater than 10 volts for high junction breakdown voltage NMOS.

With an oxide breakdown voltage of 5.5 volts, it is noted that an application of a programming voltage of at least 7 volts is required in an acceptable period of time (well below 1 second) to permanently program the antifuse from a high resistance condition to a low resistance condition. The application of at least 7 volts, however, is greater than the maximum voltage tolerable by the junctions of the MOS transistors. Consequently, the antifuse is impossible to program and therefore implement with peripheral circuitry made up of ordinary prior art CMOS transistors without additional process steps.

High Voltage Integrated Circuits

Figure 2C:
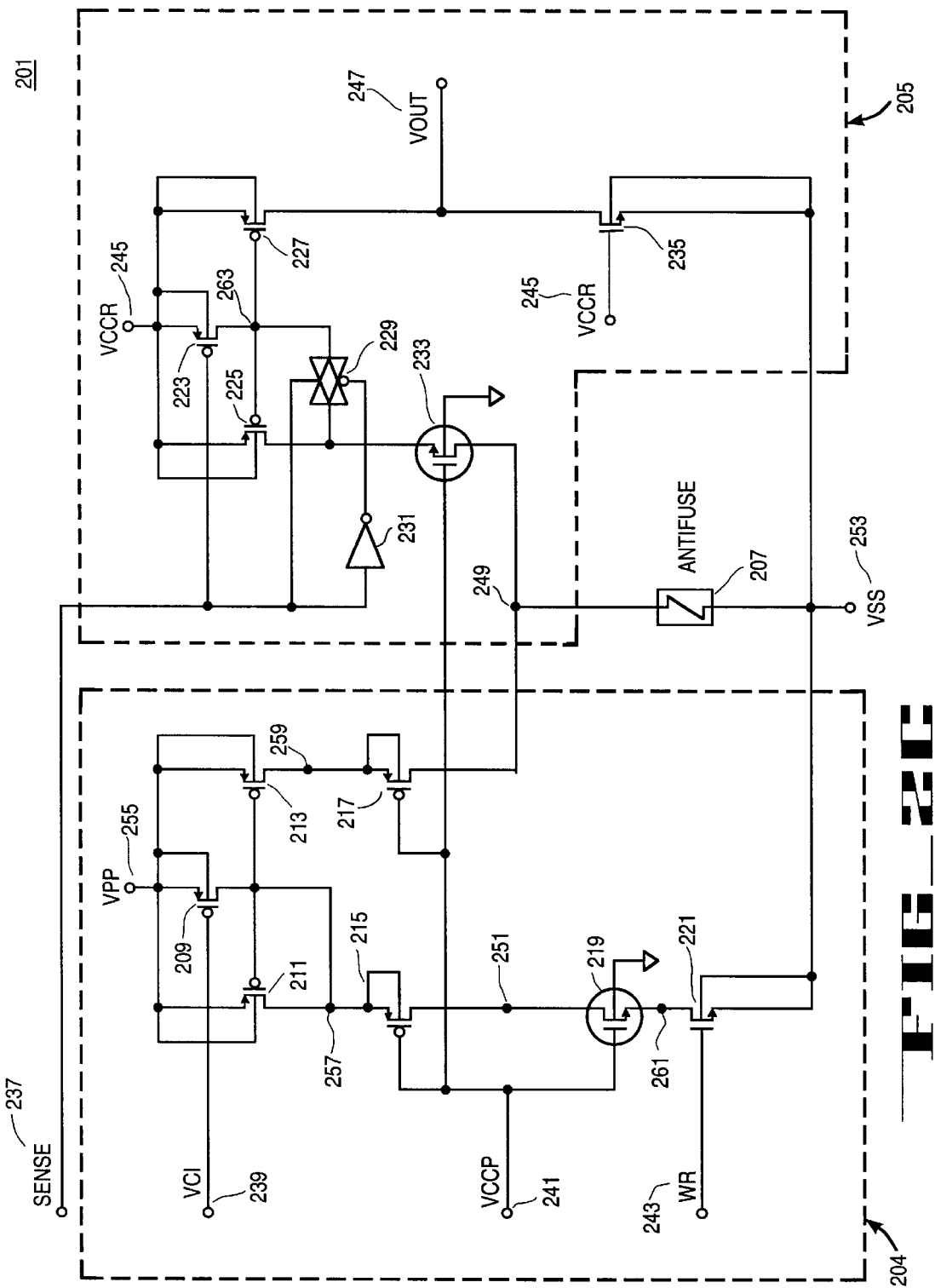

FIG. 2A is a schematic of one embodiment of the present invention which is a simple integrated circuit 30 capable of providing high voltages to program an antifuse device. It is noted that the circuits described in FIGS. 2A through 2D are also described in in co-pending application Ser. No. 08/623, 969, filed Mar. 29, 1996, entitled "Method and Apparatus for Providing High Voltage With A Low Voltage CMOS Integrated Circuit," and assigned to the Assignee of the present application.

In the embodiment shown in FIG. 2A, an unfused antifuse circuit may be programmed with the application of approximately 8 volts for a period of time. Circuit 30 features a pull up circuit coupled between VPP and output node 38 and a pull down circuit coupled between output node 38 and ground, or VSS. The pull up circuit includes p-channel transistor 32 coupled between VPP and output node 38. The pull down circuit includes series coupled n-channel devices 34 and 36 connected between output node 38 and ground, or VSS. The gate of n-channel transistor 34 is coupled to receive $V_{PROTECT}$ 35.

In the embodiment shown in FIG. 2A, VPP is about 8 volts and $V_{PROTECT}$ 35 is approximately one-half the voltage of VPP, or 4 volts. In response to control signals 31 and 33, the p-channel transistor 32 and n-channel transistor 36 may be placed in either conductive or non-conductive modes. With p-channel transistor 32 in a conductive mode and n-channel transistor in a non-conductive mode, p-channel transistor 32 pulls the voltage at output node 38 up to approximately 8 volts. Thus, an antifuse circuit connected to output node 38 would be programmed from a high resistance condition into a low resistance condition.

If control signals 31 and 33 are set to place both p-channel transistor 32 and n-channel transistor 36 in a conductive mode, n-channel transistors 34 and 36 are configured to pull the voltage at output node 38 down to approximately 4 volts. In the embodiment, an output of 4 volts is insufficient to program an antifuse. Thus, an unfused antifuse circuit connected to output node 38 would remain a high resistance condition.

With p-channel transistor 32 coupled between VPP and output node 38, and with the voltage at output node 38 swinging between only 4 and 8 volts, the substrate junctions of p-channel transistor 32 are never exposed to excessive voltages in this embodiment. It is noted that the voltage levels selected for control signal 31 are carefully selected in this embodiment to prevent the gate oxide breakdown in p-channel transistor 32 and n-channel transistors 34 and 36.

As will be described in greater detail below, circuit 30 features a special high voltage n-channel transistor 34 which has an increased drain to substrate breakdown voltage. As a result, the drain to substrate junction of n-channel transistor 34 is able to tolerate the full 8 volts at output 38 circuit during antifuse programming. It is noted that in this embodiment, the drain to substrate junction of an ordinary NMOS transistor such as n-channel transistor 36 would be unable to tolerate the full 8 volts at output node 38 during programming.

As will also be discussed in greater detail below, special high voltage n-channel transistor 34 is implemented in the process of the present invention without the addition of costly processing steps. As a result, in one embodiment of the present invention, special high voltage n-channel transistor 34 has a near zero threshold voltage, or $V_T$ equal to approximately 0 volts. In some cases, $V_T$ may be slightly greater or less than 0 volts. It is appreciated that circuit 30 is implemented to accommodate the near zero, or slightly sub-zero threshold voltage characteristics of special high voltage n-channel transistor 34. That is, circuit 30 can tolerate a situation where special high voltage n-channel transistor 34 is not turned off even with 0 volts applied from gate to source.

Therefore, with the present invention, the maximum output voltages which can be provided by integrated circuits are no longer limited by the drain to substrate junction breakdown voltage of ordinary n-channel transistors.

It is appreciated that for an output voltage swing of approximately 0 to 8 volts, circuit 30 can be easily modified to the embodiment shown in circuit 40 of FIG. 2B. Similar to circuit 30 of FIG. 2A, circuit 40 of FIG. 2B features a pull down circuit, including special n-channel transistor 44 and ordinary n-channel transistor 46, coupled between circuit output node 48 and ground, or VSS. A pull up circuit is coupled between high voltage VPP and output node 48. The pull up circuit includes series coupled p-channel transistors 42 and 49. The n-channel transistors 44 and 46 of circuit 40 are configured to pull the voltage at output node 48 down to approximately 0 volts. The gates of p-channel transistor 49 and special n-channel transistor 44 are coupled to $V_{PROTECT}$ 45. In one embodiment, $V_{PROTECT}$ 45 is approximately one-half the voltage of VPP. In response to control signals 41 and 43, the voltage at circuit output node 48 may be set to either 0 or VPP. With the two p-channel transistors 42 and 49 coupled in series between VPP and output node 48, the entire 8 volts of VPP may be distributed safely between the two p-channel transistors.

FIG. 2C is a schematic of another embodiment of the present invention, CMOS integrated circuit 201. Circuit 201 is configured to program and sense antifuse device 207 with programming circuit 203 and sensing circuit 205. Antifuse 207 is programmed with circuit 201 by applying a high programming voltage and current to antifuse device 207 for a predetermined burn time at node 249.

In the embodiment shown in FIG. 2C, programming circuit 203 includes a differential cascode voltage switch forming two current paths. One of the current paths is formed with series coupled p-channel transistors 211 and 215 and n-channel transistors 219 and 221. The other current path in programming circuit 203 includes series coupled p-channel transistors 213 and 217 and n-channel transistors 265 and 267. Antifuse device 207 is coupled to programming circuit 203 between node 249 and VSS 253. P-channel transistor 209 is coupled between high programming voltage VPP 255 and the gate and drain of p-channel transistor 211 and gate of p-channel transistor 213. The gate of p-channel transistor 209 is coupled to input voltage VCI 239 while the gate of n-channel transistor 221 is coupled to write enable signal WR 243 and the gate of n-channel transistor 267 is coupled to write disable signal WRDIS 269.

As will become more apparent in the discussion below, p-channel transistors 215 and 217 and n-channel transistors 219 and 265 act as "protect" transistors for programming circuit 203. The gates p-channel transistors 215 and 217 and n-channel transistors 219 and 265 are coupled to protect voltage VCCP 241. During high voltage operations, VPP 255 is coupled to receive a high programming voltage sufficient to fuse antifuse device 207. In addition, VCCP 241 and VCI 239 are coupled to receive half the programming voltage received by VPP 255 during high voltage operations.

Sensing circuit 205 features a current mirror circuit which also forms two current paths. One of the current paths of sensing circuit 205 includes series coupled p-channel transistor 225 and high voltage n-channel transistor 233 with its drain coupled to node 249 and antifuse device 207. The other current path of sensing circuit 205 includes series coupled p-channel transistor 227 and n-channel transistor 235. P-channel transistor 223 is coupled between input voltage VCCR 245 and the gates of p-channel transistors 225 and 227 at node 263. Pass gate 229 is coupled between node 263 and the drain of p-channel transistor 225. The sources of p-channel transistors and the gate of n-channel transistor 235 are coupled to input voltage VCCR 245 while the gate of n-channel transistor 233 is coupled to protect voltage VCCP 241. Pass gate 229 and the gate of p-channel transistor 223 are coupled to sense enable signal 237.

In one embodiment, programming and sensing circuit 201 includes four different modes of operation. The modes include idle state, writing, sensing and non-burn write. The input voltage levels associated with each mode are listed below in Table 1.

TABLE 1

| Mode | SENSE | WR | WRDIS | VPP | VCCP | VCI | VCCR |
|---|---|---|---|---|---|---|---|
| Idle State | 0 | 0 | 0 | 1.8 | 1.8 | 0 | 1.8 |
| Writing | 0 | 1.8 | 0 | 8 | 4 | 4 | 1.8 |
| Sensing | 1.8 | 0 | 0 | 1.8 | 1.8 | 0 | 1.8 |
| Non-burn Write | 0 | 0 | 1.8 | 8 | 4 | 4 | 1.8 |

While in idle state, both VCI 239 and sense 237 receive 0 volts which deactivates the differential cascode voltage switch of programming circuit 203 and the current mirror of sensing circuit 205.

When in writing mode, SENSE 237 is set to 0 volts which deactivates the current mirror of sense circuit 205. VPP 255 is set to the programming voltage of 8 volts and VCI 239 and VCCP 241 are set to half the programming voltage, or 4 volts, which activates the differential cascode voltage switch of programming circuit 203. It is important to note that at no time in one embodiment does the voltage difference between VPP 255 and VCCP 241 exceed a safe voltage, which in the embodiment is about 4 volts. WR 243 receives a logic high voltage of 1.8 volts placing n-channel transistor 221 in a conductive mode while WRDIS 269 receives a low logic level placing n-channel transistor 267 in a non-conductive mode. As a result, node 251 is pulled down to a relatively low voltage close to VSS while node 249 is pulled up to a relatively high programming voltage. Therefore, an unfused antifuse circuit 207 connected to node 249 will be programmed from a high resistance condition to a low resistance condition during a write mode operation.

In one embodiment, a voltage of approximately 8 volts is supplied to node 249 and antifuse device 207 during a write mode operation. It is noted that the special NMOS transistor having an increased drain to substrate breakdown voltage described in greater detail below is utilized for n-channel transistor 265. That is, a special n-channel transistor similar to the n-channel transistors 34 and 44 of FIGS. 2A and 2B is used for n-channel transistor 265. N-channel transistor 265 is designed to withstand extraordinarily high voltages applied to the drain to substrate junction. Accordingly, the high voltages applied to node 249 do not destroy n-channel transistor 265.

At the same time, with p-channel transistor 215 coupled between node 251 and p-channel transistor 211, the voltage drop between VPP 255 and node 251 is dropped across both p-channel transistors 211 and 215. With VCCP 241 set to half the programming voltage, the gate oxide junction breakdown voltage of 215 is not exceeded. In addition, with VCCP 241, node 257 is biased to a level no lower than VCCP+$V_{TP}$ since a voltage lower than VCCP+$V_{TP}$ would result in p-channel transistor 215 being switched off. Therefore, the relatively high voltage drop is safely distributed across both p-channel transistors 211 and 215 such that the maximum junction and gate oxide breakdown voltages are not exceeded.

During a non-burn write operation, SENSE 237 is set to 0 volts which deactivates the current mirror of sense circuit 205. VPP 255 is set to the programming voltage of 8 volts and VCI 239 and VCCP 241 are set to half the programming voltage, or 4 volts, which activates the differential cascode voltage switch of programming circuit 203. WR 243 receives a low voltage which places n-channel transistor 221 in a non-conductive mode while WRDIS 269 receives a high logic level which places n-channel transistor 267 in a conductive mode. As a result, node 251 is pulled up to the high programming voltage instead of node 249. Node 249 is pulled down to a relatively low voltage. Therefore, an unfused antifuse device 207 is not programmed during a non-burn write mode operation and remains in a high resistance condition, even though a high programming voltage is applied at VPP 255.

It is noted that the a special NMOS transistor having an increased drain to substrate breakdown voltage similar to n-channel transistor 265 described above is utilized for n-channel transistor 219 to protect the drain to substrate junction from the high voltage applied at node 251 during a non-burn write operation.

During the non-burn write mode operation, with p-channel transistor 217 coupled between node 249 and p-channel transistor 213, the voltage drop between VPP 255 and node 249 is dropped across both p-channel transistors 213 and 217. With VCCP 241 set to half the programming voltage, the gate oxide junction breakdown voltage of 217 is not exceeded. In addition, similar to the discussion with respect to node 257 above, node 259 is biased to a level no lower than VCCP+$V_{TP}$. Therefore, the relatively high voltage drop is safely distributed across both p-channel transistors 213 and 217 such that the maximum junction and gate oxide breakdown voltages are not exceeded.

During a sense mode operation, VPP 255, VCCP 241 and VCCR 245 are set to an ordinary high logic voltages. VCI 239 is set to 0 volts which deactivates the differential cascode voltage switch of programming circuit 203 while SENSE 237 is set to a high logic value which activates the current mirror of sensing circuit 205. Accordingly, corresponding currents will flow through each path of the current mirror circuit of sensing circuit 205. The amount of current which will flow through antifuse device 207 will be directly proportional to the resistance of antifuse device 207. So, the question of whether antifuse device 207 is in a high resistance condition or in a low resistance condition is easily ascertainable by the amount of current flow in sensing circuit 205 during a sense mode operation. In particular, the voltage generated at output VOUT 247 will indicate the particular condition of antifuse device 207.

It is appreciated that since the resistance of antifuse device 207 may range from low resistance to high resistance, the sizes p-channel transistors 225 and 227 and n-channel transistor 235 are carefully optimized. In one embodiment, p-channel transistor 225 is sized small enough to provide reasonable sensing margin which makes it insensitive to any fluctuation in the resistance of a fused antifuse device 207, but large enough to provide sense current for reliable sensing. N-channel transistor 235 is sized much smaller than p-channel transistor 227 to realize a high trip point level that is approximately between the voltage levels at node 263 for antifuse device 207 in low and high resistance conditions.

It is noted that since sensing circuit 205 is directly connected to antifuse device 207 at node 249, sensing circuit 205 is also exposed to the high programming voltages applied to node 249 during write mode operations. Accordingly, another special NMOS transistor similar to transistors 219 and 265 discussed above is utilized for n-channel transistor 233. During high voltage operations, i.e. when VPP 255 receives the programming voltage, the gate of n-channel transistor 233 is coupled to VCCP 241 to receive half the programming voltage. Since special n-channel transistor 233 is designed to tolerate high voltages at the drain to substrate junction, the gate oxide and drain to substrate junctions of special n-channel transistor 233 as well as p-channel transistor 225 and pass gate 229 are not destroyed by the high voltages applied to node 249.

It is also appreciated that since n-channel transistor 233 has a near zero threshold voltage, or $V_T$, as discussed above, the read margin of sensing circuit 205 is increased accordingly. That is, the read margin of sensing circuit 205 is not reduced significantly by the $V_T$ of n-channel transistor 233.

In FIG. 2D, another embodiment of the present invention is shown as programming and sensing circuit 202. Programming and sensing circuit 202 is similar to programming and sensing circuit 201 of FIG. 2C in that it includes programming circuit 204 and sensing circuit 205. Programming and sensing circuit 202 is also used to program and sense antifuse devices. The sensing circuits 204 of programming and sensing circuits 201 and 202 are the same. Programming circuit 204 of FIG. 2D differs from programming circuit 203 of FIG. 2C only in that n-channel transistors 265 and 267 and write disable signal 269 have been removed. All other device connections are generally the same.

Programming and sensing circuit 202 also features four modes of operation including idle state, write, sense and non-burn write. The associated voltage levels corresponding with each operating mode are listed below in Table 2.

TABLE 2

| Mode | SENSE | WR | VPP | VCCP | VCI | VCCR |
|------|-------|-----|-----|------|-----|------|
| Idle State | 0 | 0 | 1.8 | 1.8 | 0 | 1.8 |
| Writing | 0 | 1.8 | 8 | 4 | 4 | 1.8 |
| Sensing | 1.8 | 0 | 1.8 | 1.8 | 0 | 1.8 |
| Non-burn Write | 1.8 | 0 | 8 | 4 | 4 | 1.8 |

With respect to the idle state and sensing modes, the operation of programming and sensing circuit 202 of FIG. 2D is the same as programming and sensing circuit 201 of FIG. 2C.

During write mode operations, n-channel transistor 221 is placed in conductive mode with write enable signal WR 243 applying a high logic value to the gate of n-channel transistor 221. Accordingly, node 251 is pulled down to a relatively low voltage level while the voltage at node 249 is pulled high to a relatively high programming voltage level sufficient to program an unfused antifuse device 207 from a high resistance condition to a low resistance condition.

During a non-burn write mode operation, write enable signal WR 243 is set to a low logic value and sense enable signal SENSE 237 is set to a high logic level. Accordingly, n-channel transistor 221 is placed in a non-conductive mode which causes node 251 to be pulled up to a relatively high voltage and ties node 249 down to a relatively low voltage of VCCR 245 minus the threshold voltage of p-channel transistor 225, or VCCR-V$_{TP}$. Since VCCR 245 is set to only 1.8 volts during a non-burn write operation, the voltage at node 249 is well below the required programming voltage for antifuse circuit 207. As a result, an unfused antifuse circuit 207 is not programmed during a non-burn write operation with programming and sensing circuit 202, even though a high programming voltage is received by VPP 255.

It is appreciated that n-channel transistors 219 and 233 for FIG. 2D are also the special NMOS transistors having high drain to substrate breakdown voltage as described above. With the n-channel transistors 219 and 233, programming and sensing circuit is able to program the high voltage antifuse device 207 using an ordinary state of the CMOS process. It is noted that if ordinary CMOS n-channel transistors were used in place of special NMOS transistors 219, 233 and 265, the drain to substrate junctions of the transistors would be destroyed with the application of the high programming voltage of VPP 255 during high voltage operations such as write and non-burn write mode operations.

Special High Voltage NMOS Transistor

As indicated earlier, ordinary transistors of advanced state-of-the-art CMOS processes have junction breakdown voltages that are usually comparable or less than that of the gate oxide breakdown voltage. These breakdown voltages limit the maximum allowed voltage seen by these devices. Therefore, high voltage circuitry such as the antifuse programming and sensing circuits described above are impossible to implement with peripheral circuitry made up of ordinary prior art MOS transistors.

FIG. 3A shows a cross section of two adjacent NMOS transistors in a standard prior art process 301. A P- substrate 303 starting material is provided and a P- well 305 is implanted therein. Adjacent transistors 327 and 329 are implanted in P- well 305 with isolation regions 307 isolating the transistors from other devices on the substrate. Diffusion regions 308, 309, 311, 319 and 321 are formed in P- well 305 to form transistors 327 and 329. A thin insulating layer, or gate oxide, 317 is formed over the substrate and then gates 315 and 325 are formed above the thin insulating layer 317. Conducting channels 313 and 323 exist between the corresponding source and drain diffusion regions of each transistor 327 and 329.

In general, the doping concentration of P- well 305 is higher than the doping concentration of P- substrate 303. With a relatively high doping concentration in P- well 305 in combination with an isolation region, or field oxide region 307, sufficient isolation is provided to transistors 327 and 329 to shield the transistors from other devices on the substrate. Without the adequate isolation, undesirable conducting paths, or channels, would exist between neighboring diffusion regions. For instance, without isolation region 307, there would be an undesirable conducting path between neighboring N+ diffusion regions 311 and 319 of FIG. 3A.

FIG. 3B shows a similar standard CMOS process 330 cross-section with trench isolation 337 between NMOS transistor 359 and PMOS transistor 357. As shown in FIG. 3B, an additional N- well is selectively implanted into the substrate to provide an N- doped well for p-channel transistor 357. N+ diffusion substrate connection 338 and P+ diffusion regions 339 and 341 are implanted into N- well 335 to form p-channel transistor 357. Similar to the NMOS transistors 327 and 329 described in FIG. 3A, isolation region 337 in combination with the adequately doped N- and P- well regions 335 and 333 provide isolation for p-channel transistor 357 and n-channel transistor 359. In other words, there are no undesirable conducting paths between neighboring diffusion regions such as P+ diffusion region 341 of transistor 357 and N+ diffusion region 349 of transistor 359.

With respect to the need for the present invention to provide a special transistor with a high junction breakdown voltage, breakdown voltages may be increased by reducing the doping concentration of associated substrate materials. In other words, if a diffusion region is implanted into a substrate with a lowered concentration of doping, the corresponding junction breakdown voltage is increased. A significant consequence, however, of reducing the doping concentration of a substrate into which a diffusion region is implanted is that adequate isolation of the implanted diffusion regions is severely compromised.

For example, referring to process 360 of FIG. 3C, diffusion regions 364, 365, 367, 375 and 377 are implanted into a P- substrate 361 with a low doping concentration. With the low doping concentration of P- substrate 361, an increased junction breakdown voltage is realized by n-channel transistors 383 and 385. Without adequate doping of P- substrate 361, however, an undesirable conducting path 387 under field oxide region 363 exists. Thus, transistors 383 and 385 are not isolated from one another.

The consequence of the undesirable conducting path existing between transistors is explained by the fact that with P- substrate 361 having a low doping concentration, the threshold voltage V$_T$ of conducting path 387 through field oxide region 363 is less than 0 volts. Therefore, conducting paths exist between transistors independent of voltages applied to the transistor gates 371 and 381.

In FIG. 4, one embodiment of the present invention is shown. Process 401 utilizes an innovative layout arrangement for a well implant into a substrate for transistor fabrication. It is appreciated that the innovative layout of the present invention is realized by using the same well implantation steps used in existing state-of-the-art CMOS processing. That is, no costly processing steps must be added to existing state-of-the-art CMOS processing to realize the present invention. In addition, it is noted that even though process 401 is shown using P substrate technology, the circuit may be reversed accordingly for applications suitable for N substrate technology without departing from the broader spirit and scope of the present invention. In that case, the special high voltage device would become a P device and all of the signs of the implants would be reversed.

In one embodiment the present invention, a P– well implant 405 is implanted into a P– substrate 403. So, p– well 405 has a higher doping concentration than P– substrate 403. In one embodiment of the present invention, P– substrate 403 is formed from epitaxially grown P– type start material. In that embodiment, P– well implant 405 receives greater impurity levels by one to two orders of magnitude.

As shown in FIG. 4, the P– well implant 405 is blocked from the P well implant blocked region 407A. Afterwards, diffusion regions 411, 413, 415, 423 and 425 are implanted into P– well 405 and/or P– substrate material 403 as shown. Field oxide regions 409 are formed as well as gate oxide 421 over the substrate. Gates 419 and 429 are formed over gate oxide 421 above channels 417 and 427.

As shown in FIG. 4, n-channel transistors 431 and 433 are isolated from each other with field oxide region 409 in combination with the P– well implant 405. Since P– well 405 has a sufficiently high doping concentration, field oxide region 409 adequately isolates transistor 431 from transistor 433. In particular, the threshold voltage $V_T$ of the region between neighboring N– diffusion regions 415 and 423 is much greater than the power supply voltage. As a result, there is no unwanted conducting path between transistors 431 and 433.

In one embodiment of the present invention, N+ diffusion region 423 is configured to be the source of transistor 433 and N+ diffusion region 425 is configured to be the drain of transistor 433. With P– substrate 403 having a lower doping concentration, it is appreciated that the drain to substrate junction of transistor 433 has a higher junction breakdown voltage in comparison with the junction breakdown voltages between N+ diffusion regions 413, 415, and 423 and P– well 405. It is also noted that the source to substrate junction breakdown voltage of transistor 433 is the same as the junction breakdown voltages of transistor 431. With reference to the special NMOS transistors discussed in connection with FIGS. 2A through 2D above, it is appreciated that special NMOS transistors used in FIGS. 2A through 2D only require high voltage for the drain to substrate junctions. Accordingly, a transistor such as n-channel transistor 433 is ideally suited to be used as the special NMOS transistors in FIGS. 2A through 2D above.

Therefore, with n-channel transistor 433, high drain to substrate junction breakdown voltage is realized. In addition, with the P– well implant blocked region 407A as shown in FIG. 4, transistors 431 and 433 are adequately isolated from one another with field oxide region.

It is noted that P– well implant blocked region 407A may extend to boundary 407B as shown in FIG. 4 such that source diffusion region 423 is implanted entirely in P– well 405. Drain diffusion region 425 still enjoys the high junction breakdown voltage which provides the adequate high voltage tolerance for high voltage circuit applications.

It is also noted that since no processing steps are added to the process described herein, no extra implants are added to control the threshold voltage, or $V_T$, of n-channel transistor 433. As a consequence, the $V_T$ of n-channel transistor 433 in one embodiment is near zero, or even slightly greater or less than zero in some cases. Although this near zero threshold voltage characteristic is undesired in some situations, the circuits described above utilizing special high voltage n-channel transistor 433 have been implemented to tolerate this characteristic.

Figure 5H:
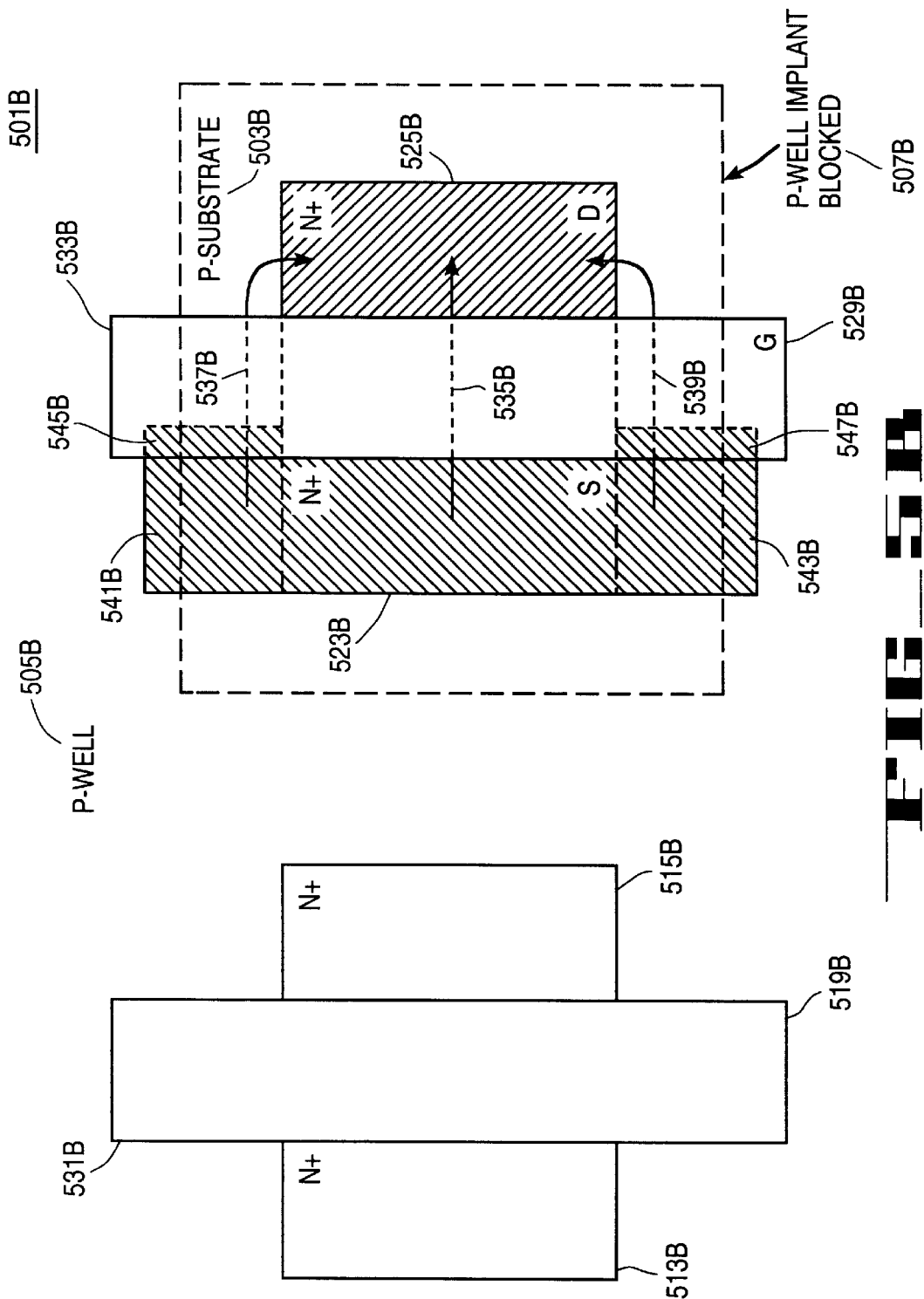
FIG. 5A is a layout view of a MOS transistor suffering from inadequate source and drain isolation.
FIG. 5B is a top layout view of one embodiment of a high voltage transistor in accordance with the teachings of the present invention.

FIG. 5A shows one possible top layout configuration of a transistor pair 531A and 533A in which a P– well implant has been blocked from a region 507A over transistor 533A. In FIG. 5A, only P– substrate material 503A exists within P– well implant block region 507A and P– well material 505A exists outside P– well implant block region 507A. Transistor 531A is an n-channel transistor featuring diffusion regions 513A and 515A with gate 519A disposed over a channel region existing between diffusion regions 513A and 515A. Transistor 531A is an ordinary n-channel transistor with ordinary junction breakdown voltages.

Transistor 533A also includes diffusion regions 523A and 525A with gate 529A disposed over a channel region existing between diffusion regions 523A and 525A. As shown in FIG. 5A, drain region 525A is implanted entirely into P– substrate material 503A while source diffusion region 523A is partially overlapped by P– well implant blocked region 507A. With gate 529A disposed over the corresponding channel region, conductive path 535A exists between source 523A and drain 525A. When zero volts are applied to gate 529A, conducting path 535A is switched off. In addition, the junction breakdown voltage between drain 525A and substrate 503A is higher than the junction breakdown voltage of diffusion regions 513A, 515A, and 523A and P– well 505A.

A fatal problem with the layout of transistor 533A as shown in FIG. 5A, however, is that conductive paths exists between the source 523A and drain 525A at the edges of transistor 533A. It is noted that thin oxide material exists over the diffusion regions of CMOS process 501 A while field oxide regions exist in the non-diffusion regions. As a result, field oxide regions exist at the edges of transistor 533A. It is further appreciated that at the edges of transistors 533A, the field oxide region exists in low-doped P– substrate material 503A. Consequently, the threshold voltage $V_T$ of the field oxide regions in P– substrate material 503A at the edges of the transistor is less than 0 volts. As a result, undesirable conductive paths 537A and 539A exist between source 523A and drain 525A, even though transistors 531A and 533A are adequately isolated from one another with P– well 505A and the corresponding field oxide region existing between transistors 531A and 533A. Even with gate 529A coupled to ground, conductive paths 537A and 539A cannot be shut off through the field oxide regions existing at the edges of transistors 533A in P– substrate material 503A since $V_T$ is less than zero volts at the edges of transistor 533A. Consequently, transistor 533 does not function properly.

FIG. 5B shows a top down layout view of transistor pair 531B and 533B in which the problem with the unwanted conductive paths 537A and 539A of FIG. 5A have been corrected. As shown in FIG. 5B, P– well 505B has been partially blocked over P– well implant blocked region 507B such that low doped P– substrate material 503B exists inside P– well implant block region 507B while P– well 505B exists outside P– well implant blocked region 507B. Source 523B and drain 525B are implanted into P– substrate material 503B and gate 529B is disposed over the channel region existing between source 523B and drain 525B. Note that additional "wings" 541B and 543B have been added to source 523B such that the source diffusion region of transistor 533B extends into the P– well 505B region and that gate 529B is overlapping portions 545B and 547B of wings 541B and 545B, respectively, as shown in FIG. 5B.

As described earlier, thin oxide exists above all diffusion regions in CMOS process 501B. So, thin oxide exists in overlapped regions 545B and 547B. Therefore, the threshold voltage $V_T$ associated with the overlapped regions 545B and 547B is greater than 0 volts. As a result, the conducting paths 537B and 539B as well as conducting channel 535B may be switched off with gate 529B by applying zero volts overlapped regions 545B and 547B with gate 529B.

It is noted that the paths formed by conducting paths 537B and 539B may be considered as parasitic transistors operating in parallel with the main device controlling conducting path 535B. The three transistors share common gate 529B. When conducting path 535B is switched on, conducting paths 537B and 539B are also switched on. Moreover, the main conducting path 535B and the parasitic conducting paths 537B and 539B may be switched off with common gate 529B.

Therefore, with diffusion regions 541B and 543B extending to an area in P– well 505B outside the P– well implant blocked area 507B, proper source to drain isolation is realized. The high voltage transistor 533B has an increased drain to substrate junction breakdown voltage while adequate isolation is achieved as shown in FIG. 5B.

It is appreciated that an alternate embodiment of the present invention may be realized with diffusion 523B configured to be a drain and diffusion 525B configured to be a source. In this alternative embodiment, the source would have a high source to substrate junction breakdown voltage and the drain would have an ordinary drain to substrate junction breakdown voltage.

In FIG. 6, another embodiment of the present high voltage transistor 601 is shown. Similar to the high voltage transistor shown in FIG. 4, a P– substrate start material 603 is provided and a P– well 605 is implanted into P– substrate 603 with the P– well implant blocked from a P– well implant blocked region 607. As stated above, blocking P– well 605 from being implanted into P– well implant blocked region 607 adds no costly process steps to the state-of-the-art CMOS process. In addition, diffusion regions 611, 623A, 623B and 625 are implanted into P– well 605 and/or P– substrate 603 as shown in FIG. 6. Field oxide regions 609 are formed in P– well 605 and thin oxide 621 is formed over P– well 605 and P– substrate 603. Gates 629A and 629B are formed over channel regions 627A and 627B.

As shown in FIG. 6, transistor 633 is an edgeless transistor. So, there is no isolation region, or field oxide 609, in P– well implant blocked region 607. As a result, there are no isolation problems since there are no field oxide regions 609 formed in low doped P– substrate material 603 which have a threshold voltage $V_T$ of less than zero.

In one embodiment, diffusion region 625 is configured as a drain and diffusion regions 623A and 623B are configured as the source of transistor 633. In the embodiment, gates 629A and 629B are coupled together such that when a high logic voltage is applied, conducting channels 627A and 627B existing between drain 625 and source regions 623A and 623B are switched on. Conversely, when zero volts are applied to gates 629A and 629B, conducting channels 627A and 627B are shut off.

Figure 7:
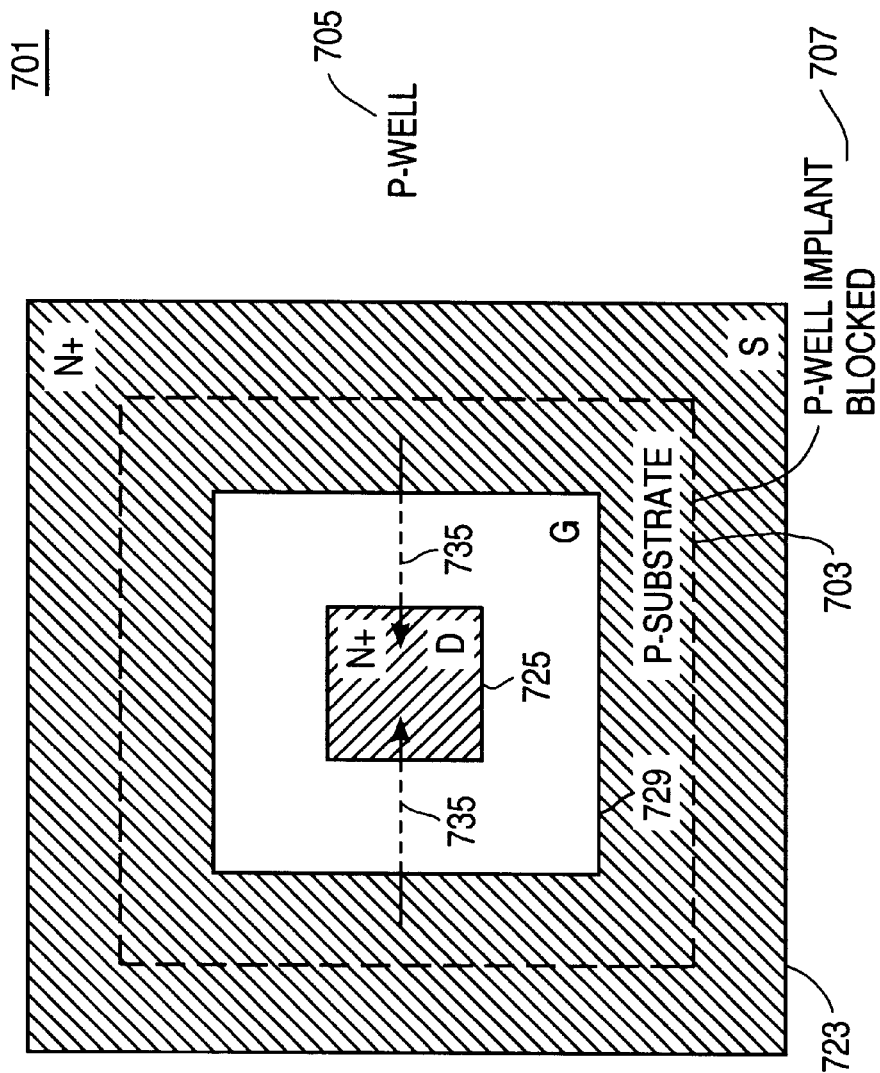
FIG. 7 is a top layout view of another embodiment of a high voltage MOS transistor in accordance with the teachings of the present invention.

FIG. 7 shows a top layout view of the embodiment shown in FIG. 6. P– substrate start material 703 is used and a P– well 705 is implanted outside P– well implant blocked regions 707. Thus, a higher doped P– well 705 is formed outside P– well implant blocked region 707 and low doped P– substrate material exists inside P– well implant blocked region 707. Drain diffusion region 725 is formed within P– well implant blocked region 707. Source diffusion region 723 is formed around drain diffusion region 725 on the substrate such that a region of P– substrate 703 material exists between drain diffusion region 725 and source diffusion region 723. Gate 729 is formed over the region between drain 725 and source 723. Accordingly, a conductive path 735 exists between source 723 and drain 725 and transistor 701 is formed. Conductive path 735 is shut off with zero volts applied to gate 729. If a voltage higher than the threshold voltage of conductive path 735 is applied to gate 729, then transistor 701 is switched on.

It is noted that an alternative embodiment of transistor 701 may be realized by configuring diffusion region 725 to be a source region and configuring diffusion region 723 to be a drain. The alternative embodiment would have a high junction breakdown for the source side and an ordinary junction breakdown voltage for the drain side.

It is appreciated that the devices described in FIGS. 4–7 are fabricated with significantly longer channel lengths compared to the minimum length allowed for ordinary transistors to avoid reach-through. Without a P– well implant in the channel regions under the gate area, the depletion regions of such devices become much larger than in ordinary devices. Consequently, reach-through would occur if depletion regions from the source and drain overlapped. As a result, channel lengths are increased to further separate the source and drain regions to avoid reach-through problems. Further, in the embodiment shown in FIG. 5B, the size of the poly gate end caps is also increased to avoid reach-through problems.

In sum, a high voltage transistor with a high junction breakdown voltage is realized without adding additional costly masking, implantation or doping steps. The described transistor is suitable for any high voltage application using an ordinary low voltage tolerant CMOS process, such as the circuits described in FIGS. 2A through 2D.

In the foregoing detailed description, an apparatus and method for forming a transistor suitable for a high voltage circuit is described. The apparatus and method of the present invention has been described with reference to specific exemplary embodiments thereof. It will, however, be evident that various modifications and changes may be made thereto without departing from the broader spirit and scope of the present invention. The present specification and drawings are accordingly to be regarded as illustrative rather than restrictive.

What is claimed is:

1. A method for forming a transistor suitable for a high voltage circuit, the method comprising:

forming a first diffusion region and a second diffusion region in a substrate of a complementary metal oxide semiconductor (CMOS) integrated circuit, wherein one of the first and second diffusion regions is a source region, the other one of the diffusion regions is a drain region and a channel is defined between the first and second diffusion regions;

defining a well implant block region wherein one of the first and second diffusion regions is disposed within the well implant block region and at least a portion of the other one of the first and second diffusion regions is disposed outside of the well implant block region;

implanting a well in the substrate outside of the well implant block region;

blocking a well implant in the substrate inside the well implant block region; and forming a gate above the channel.

2. The method described in claim 1 further comprising:

forming an insulative layer above the channel between the substrate and the gate.

3. The method described in claim 1 wherein the first diffusion region is the drain region and the second diffusion region is the source region.

4. The method described in claim 1 wherein the first diffusion region is the source region and the second diffusion region is the drain region.

5. The method described in claim 3 wherein the source region comprises a first portion and a second portion such that the source region is arranged on the substrate such that the gate is formed over the first portion of the source region and not over the second portion of the source region.

6. The method described in claim 5 wherein the first portion of the source region is disposed between the second portion of the source region and the drain such that no conductive path exists between the source and drain in response to a first potential applied to the gate.

7. The method described in claim 4 wherein the drain region comprises a first portion and a second portion such that the drain region is arranged on the substrate such that the gate is formed over the first portion of the drain region and not over the second portion of the drain region.

8. The method described in claim 7 wherein the first portion of the drain region is disposed between the second portion of the drain region and the source such that no conductive path exists between the source and drain in response to a first potential applied to the gate.

9. The method described in claim 3 wherein source region is disposed in the substrate around the drain region and wherein the channel is disposed in the substrate around the drain region between the source region and the drain region.

10. The method described in claim 4 wherein drain region is disposed in the substrate around the source region and wherein the channel is disposed in the substrate around the source region between the drain region and the source region.

11. A method for forming an n-channel transistor suitable for a high voltage circuit, the method comprising:

providing a p-type epitaxially grown substrate of a complementary metal oxide semiconductor (CMOS) integrated circuit;

blocking a p-well implant over a blocked region on the substrate;

forming a drain within the blocked region in the substrate;

forming a source separated from the drain in the substrate such that a channel is disposed in the substrate between the source and the drain, the source at least partially outside the blocked region; and forming a gate above the channel.

12. The method described in claim 11 wherein forming the source includes forming the source around the drain such that the channel is formed around the drain between the source and the drain.

13. The method described in claim 11 wherein forming the source includes forming the gate above a first portion of the source, wherein the first portion of the source is disposed between the drain and a second portion of the source.

14. The method described in claim 13 wherein a gate oxide is formed above the channel between the substrate and gate and above the source and drain.

15. The method described in claim 13 wherein the drain has a first junction breakdown voltage and the source has a second junction breakdown voltage, wherein the first junction breakdown voltage is greater than the second junction breakdown voltage.

* * * * *

UNITED STATES PATENT AND TRADEMARK OFFICE
CERTIFICATE OF CORRECTION

PATENT NO. : 6,096,610
DATED : August 1, 2000
INVENTOR(S) : Alavi et al.

Page 1 of 1

It is certified that error appears in the above-identified patent and that said Letters Patent is hereby corrected as shown below:

Column 2,
Line 9, after "circuit", insert -- 10 --.

Signed and Sealed this

Seventeenth Day of September, 2002

Attest:

Attesting Officer

JAMES E. ROGAN
Director of the United States Patent and Trademark Office